Figure 1:
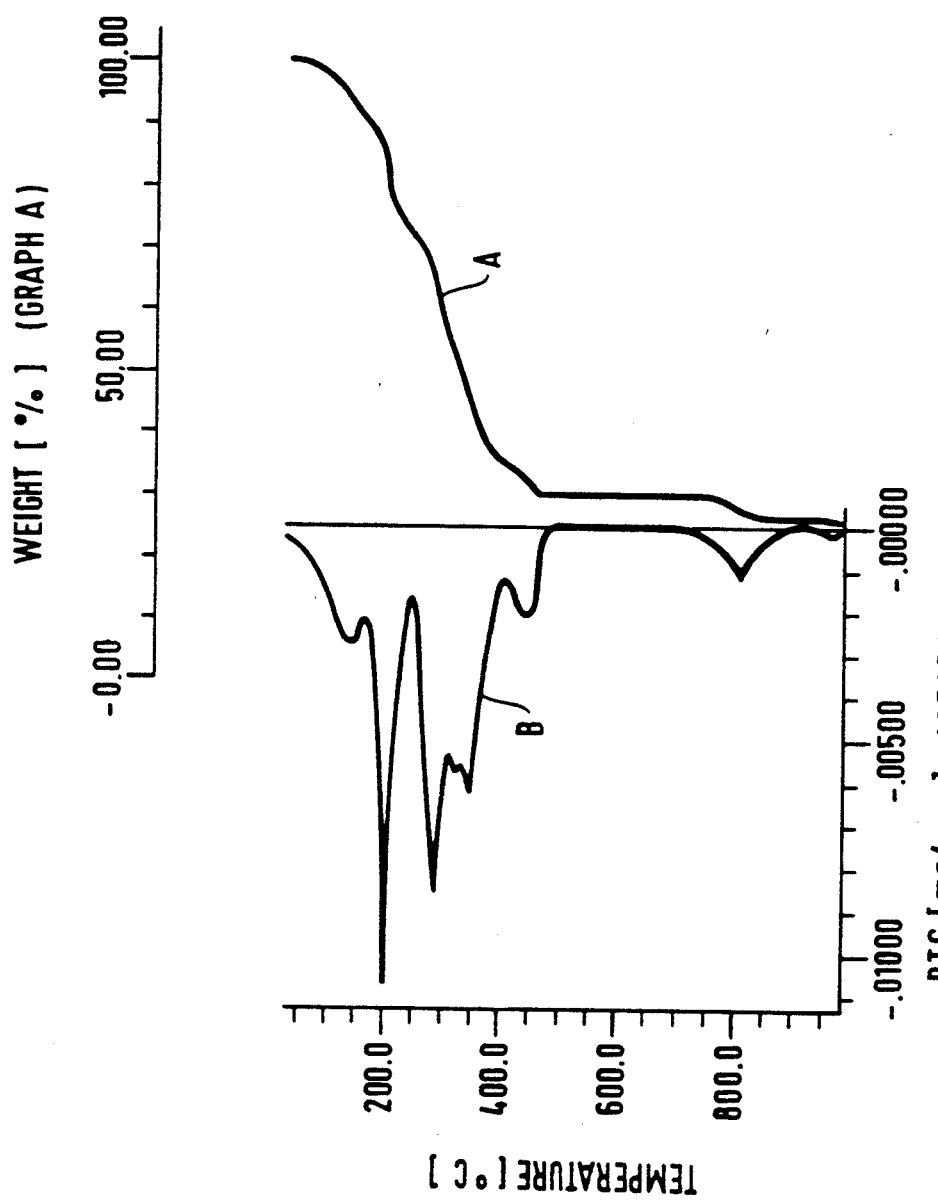

United States Patent [19]

Becker

[11] Patent Number: 5,229,359

[45] Date of Patent: Jul. 20, 1993

[54] SOLUTION AND ITS USE TO PRODUCE SUPERCONDUCTING FILAMENTS AND COATINGS

[75] Inventor: Winfried Becker, Kelkheim/Taunus, Fed. Rep. of Germany

[73] Assignee: Hoechst Aktiengesellschaft, Frankfurt am Main, Fed. Rep. of Germany

[21] Appl. No.: 695,294

[22] Filed: May 3, 1991

[30] Foreign Application Priority Data

May 7, 1990 [DE] Fed. Rep. of Germany ....... 4014570

[51] Int. Cl.$^5$ .................. C01F 11/02; C01G 3/02; H01L 39/24
[52] U.S. Cl. ................. 505/1; 505/734; 505/735; 505/737; 505/740
[58] Field of Search ............... 505/741, 740, 738, 737, 505/1, 735, 734

[56] References Cited

U.S. PATENT DOCUMENTS

| | | | |
|---|---|---|---|
| 4,931,427 | 6/1990 | Chien | 505/734 |
| 4,954,480 | 9/1990 | Imanaka | 505/1 |
| 4,962,082 | 10/1990 | Barboux | 505/1 |
| 4,978,515 | 12/1990 | Johnson | 505/1 |
| 4,988,671 | 1/1991 | Johnson | 505/1 |
| 5,063,199 | 11/1991 | Budd | 505/734 |
| 5,066,625 | 11/1991 | Philipp | 501/127 |
| 5,066,636 | 11/1991 | Liu | 505/1 |

FOREIGN PATENT DOCUMENTS

| | | |
|---|---|---|
| 0341030 | 11/1989 | European Pat. Off. |
| 0360550 | 3/1990 | European Pat. Off. |
| 0084515 | 3/1989 | Japan ................. 505/741 |

OTHER PUBLICATIONS

Behrman "Synthesis, Characterization, and Fabrication of High Temp . . . " *Advanced Cer. Mat'ls* v.2(3B) Jul., 1987 pp. 539–555.

McClusky "Organo-metallic preparation of $Ba_2YCu_3O_{7-x}$" Superconductivity and its Applications Apr., 1988 pp. 100–104.

Catania "Superconducting yttrium barium copper oxide fibers . . . " *Mater. Res. Bull.* v. 25(12) 1990 (no month) pp. 1477–1485.

Catania "Influence of sol-gel methods on the conductivity . . . " *Mater. Res. Bull.* v. 25(5) 1990 (no month) pp. 631–642.

J. Savage "Screen Printing Materials and Procedures" Handbook of Thick Film Tech. 1976 pp. 50–59.

World Patent Index Latest, Accession No. 89-096327.
World Patent Index Latest, Accession No. 89-072181.

H. G. v. Schnering et al., *Agnew. Che.*, vol. 100, No. 4, (1988), S. 604 ff.

H. G. v. Schnering et al., *Agnew Chem. Int. Ed. Engl.*, vol. 27, No. 4, (1988), S. 574 ff.

*Primary Examiner*—Paul Lieberman
*Assistant Examiner*—John Boyd
*Attorney, Agent, or Firm*—Curtis, Morris & Safford

[57] ABSTRACT

Solutions containing the cations of the metals Y, Ba, Cu in the atomic ratio 1:2:3 or the cations of the metals Bi, Sr, Ca and Cu having the atomic ratios of a high-temperature superconductor bound to polyacrylic acid in water as dispersant and having a viscosity of 150–10,000 cSt (at 20° C.) serve to produce superconducting filaments or coatings.

To produce a superconducting filament, a solution is forced through a nozzle and the extruded filamentous strand is left to solidify in an organic solvent which is miscible with water, the filament is isolated, dried and heated to at least 800° C. in the presence of oxygen, annealed at at least 800° C. for at least one hour in the presence of oxygen and then cooled.

10 Claims, 2 Drawing Sheets

SOLUTION AND ITS USE TO PRODUCE SUPERCONDUCTING FILAMENTS AND COATINGS

The invention relates to a highly viscous solution which contains the cations of the metals copper and yttrium, barium or Bi+Sr+Ca in particular quantitative ratios, a process for producing the solution and the use of the solution to produce a superconducting filament or a superconducting coating on a thermally resistant substrate.

Since the discovery of the superconducting properties of lanthanum barium cuprate by Bednorz and Müller, a multiplicity of further superconducting oxide ceramics have been found. These compounds have high critical temperatures ($T_c$), some of which are above the boiling point of nitrogen. Since this coolant is substantially cheaper than helium, the operating costs of superconducting appliances and installations are reduced considerably. Suitable superconducting oxide ceramics which open up new, extensive application possibilities are therefore of great technical interest.

All the novel superconductors are nonductile oxide ceramics which have the disadvantage that they can only be processed with difficulty to form the fibers, filaments, strips or layers necessary for the technical applications. There was therefore the object of developing a process with which oxidic superconductors can be produced in the form of filaments or coatings.

The invention is based on the discovery that it is possible to produce from water-soluble metal salts and low-molecular-weight polyacrylic acid viscous solutions which can be processed well in contact with suitable organic precipitation baths to form compact filaments, strips or layers which can be converted into superconductors with the shape being retained.

The rheological properties of these viscous solutions can be varied within wide limits, and consequently optimized for various applications, by means of the molecular weight of the polyacrylic acid, the concentration of metal polyacrylate, the excess of polyacrylic acid and the pH of the solution.

The viscous solutions according to the invention contain the cations of the metals Y, Ba, Cu or of the metals Bi, Sr, Ca and Cu in atomic ratios corresponding to those of a high-temperature superconductor and bound to polyacrylic acid with water as dispersant. In the case of the Y-Ba-Cu superconductor, the Y:Ba:Cu atomic ratio is 1:2:3. High-temperature superconductors which contain the metals Bi, Ca, Sr and Cu are known, together with their composition, to the person skilled in the art, for example, from H. G. Schnering et al., Angew. Chemie, 100 (1988) 604.

Solutions according to the invention which contain Y, Ba and Cu can be prepared by dissolving water-soluble salts of the metals Y, Ba and Cu in water or acid-soluble salts in acid in an atomic ratio of 1:2:3, adding an aqueous solution of polyacrylic acid to the solution so that 0.03 to 0.15 atoms of $Y^{3+}$ are present per carboxyl group of the polyacrylic acid, and adjusting the pH to a value of 10 to 11 by adding a thermally degradable base. Working with aqueous acids is preferred.

Preferably, the polyacrylic acid used has an average molecular weight in the range from 1000 to 10,000, in particular 2000 to 5000. Up to 50% by weight of a polyacrylic acid with higher molecular weight, in particular from $5 \times 10^5$ to $1 \times 10^6$ may further be added to this polyacrylic acid and a marked increase in the viscosity thereby obtained, with the same amount of acrylate units in the solution.

Ammonia or tetramethylammonium hydroxide, for example, can be used as thermally degradable base. The use of non-thermally degradable bases such as, for example, sodium hydroxide results in an undesirable contamination of the superconductor by foreign cations. At a pH of at least 10, in particular from 10 to 11, the metal acrylate solution has an adequate viscosity for spinning. pHs of over 11 do not have any advantages.

It is expedient to concentrate the mixtures until they have a viscosity of 150 to 10,000 cSt. Solutions having a still higher viscosity can be processed only with difficulty. In principle, for the same viscosity, as high as possible a concentration of cations is, however, desirable. In general, processable gels/solutions have concentrations of 200 to 400 g/l polyacrylate (calculated as free polyacrylic acid).

Solutions according to the invention which contain the cations of the metals Bi, Sr, Ca and Cu can be prepared by dissolving water-soluble salts of these metals in water or acid-soluble salts of these metals in acid in an atomic ratio which corresponds to a high-temperature superconductor, combining the solution with an aqueous solution of polyacrylic acid, 0.04 to 0.4 atoms of $Cu^{2+}$ being present per carboxyl group of the polyacrylic acid, and the pH being adjusted to a value of at least 10 by adding a thermally degradable base. For the polyacrylic acid used, the statements made above apply.

The nitrates of Y, Ba, Sr and Cu are readily water-soluble. The nitrates of Bi dissolve in acid. Satisfactorily high metal concentrations in the viscous solution can therefore be obtained with their aid.

To produce a superconducting filament, a viscous solution described is forced through a nozzle and the extruded filamentous strand is left to solidify in an organic solvent which is miscible with water. The blue filament is isolated, possibly cut up into pieces, dried, and depending on the nature of the superconductor to be formed, heated to a temperature of at least 800° C. in the presence of oxygen, annealed for at least one hour in the presence of oxygen at at least 800° C., and then cooled.

The nozzle is normally circular. Preferably its diameter is in the range from 0.1 to 5 mm, in particular 0.5 to 2 mm. If slot-type nozzles are used, strips are obtained instead of filaments. FIG. 1 shows a scanning electron micrograph (500×) of a superconducting filament.

The organic solvents used extract the water from the viscous solution. The solid metal polyacrylates are consequently re-formed.

In particular, methanol, ethanol or acetone can be used as organic solvents which are miscible with water.

To avoid an embrittlement of the extruded strands on drying, a plasticizer can be added to the viscous solution. Polyhydric alcohols, for example, in particular glycerol or ethylene glycol, serve as plasticizers. The proportion added is 0 to 12, in particular 2 to 10, parts by weight, based on the mass of the viscous solution before concentration. It has been found that the filaments produced can be kept better if a compound which has a crosslinking effect on polyacrylic acid, i.e. contains at least two radicals which react with carboxylate groups such as, for example, a bisepoxide or diisocyanate is added to the organic solvent used for the precipitation. Diethylene glycol bisepoxide or diphenylmethane diisocyanate (with acetone as organic solvent), for example, can be used. These agents crosslink the surface of the resulting strand during extrusion and thus ensure a better stability.

The viscous solutions described are deep blue, colloidally dispersed and exhibit the Tyndall effect. They are also suitable for producing a superconducting coating on a thermally resistant substrate. For this purpose, a solution according to the invention is applied to the thermally resistant substrate in a thin layer, the substrate is dried and, depending on the nature of the superconductor to be formed, substrate and coating are heated to 800° to 1000° C. in the presence of oxygen, annealed at at least 800° C. for at least one hour and then cooled. Suitable coating processes are, for example, dip coating or spin coating. Plates made of $Al_2O_3$, MgO, $SrIn_2O_4$, $ZrO_2$, $SiTiO_3$, $CaTiO_3$ and $LaGaO_3$ can be used as thermally resistant substrates for this purpose.

The drying of the solutions takes at least 30 minutes. Still better are at least 60 minutes, in particular at least 2 hours. Here again, the addition of plasticizers is good, since the formation of cracks or lumps during drying can be avoided in this way. Thermogravimetric investigations have shown that the decomposition of polyacrylates takes place relatively steadily in air between 100° C. and 400° C. If it is desired, therefore, to heat the filaments or layers to 800° C., it is advantageous first to raise the temperature slowly in the range between 100° and 400° C. Unduly high heating rates result in a combustion with the appearance of flames and consequently in their destruction. Heating from room temperature to 400° C. in 10 hours and holding at 400° C. for 5 hours proved to be suitable. The further heating to temperatures of at least 800° C. depends on the composition of the superconductor.

For a superconductor of the $YBa_2Cu_3$, $O_{7-x}$ type, the further heating to 800° to 1000° C., in particular 950° C., can be carried out in 4 hours. The annealing at 800° to 900° C. takes at least one hour, advantageously at least 2 hours and in particular at least 4 hours. It is also carried out in the presence of oxygen. Then the sample is cooled slowly to 400° C. during at least one hour, preferably during at least 2 hours and kept at this temperature for at least 10 hours.

In the case of Bi-containing superconductors, the further heating to 800°-860° C., in particular to 850° C., is preferably carried out in at least 4 hours. Annealing is carried out at 800°-860° C. during at least one hour in the presence of oxygen, preferably during at least 2 hours. Slow cooling does not result in any advantages in this case.

The invention is explained in greater detail by the examples.

EXAMPLE 1

Solution 1: 2.2 g of $Y(NO_3)\cdot 5H_2O$, 3.16 g of $Ba(NO_3)_2$ and 4.4 g of $Cu(NO_3)_2\cdot 3H_2O$ are dissolved in 60 ml of $H_2O$ at 80° C.

Solution 2: 16 g of a 50%-strength aqueous polyacrylic acid solution having an average molecular weight of 5000 are diluted with 40 ml of water to 14.3% by weight.

Solution 3: 0.4 g of polyacrylic acid (MW 500,000 to 1,000,000) are dissolved in approximately 20 ml of concentrated ammonia solution.

Figure 2:

The three solutions are combined and the cloudiness produced is dissolved again with about 10 ml of concentrated ammonium hydroxide solution. The pH is 10-11. 20 ml of ethylene glycol are then added. The clear, dark-blue solution is then evaporated down under normal pressure at 60° C. in the course of 48 hours until the viscosity of honey is reached. A measurement gives the result of 180 cSt. The pH is 10-11. The solution thus produced is forced through a nozzle having a diameter of 0.5 mm into methanol, in which process long bright-blue elastic filaments having a diameter of 0.25 mm are produced. These are cut up into fibers approximately 10 cm long. They are heated in 10 hours from room temperature to 400° C., held for 5 hours at this temperature, heated during 4 hours to 950° C. and kept at this temperature for 6 hours (in the presence of air). The sample is then cooled to 400° C. in 4 hours and kept at this temperature for 10 hours. Fibers composed of $YBa_2Cu_3)_7$ and having a diameter of 0.1 mm and a critical temperature of 89 K are obtained. FIG. 2 shows a scanning electron micrograph of a fiber.

If solution 3 (polyacrylic acid with high molecular weight) is omitted from the mixture, a clear solution first forms from which a thick bulky deposit of the polyacrylates is precipitated on neutralizing with ammonia. These redissolve again at pHs of above 10 and a dark-blue, highly viscous solution is formed. Filaments can be produced but these are of uneven thickness and are brittle. If, on the other hand, use is made exclusively of polyacrylic acid having a molecular weight of 500,000 to $10^6$, this starting product dissolves with great difficulty and non-swelling deposits which are not inherently stable are formed on precipitation.

EXAMPLE 2

Example 1 is repeated, but 10% by weight of diethylene glycol bisepoxide is added to the solvent into which extrusion takes place. The precursor fibers obtained are then more elastic and easier to handle.

EXAMPLE 3

Coating a plate

First a solution having a viscosity of 4500 cSt is produced in accordance with Example 1. A support plate composed of $Al_2O_3$ ($10\times50\times0.3$ mm) is dipped into this solution and pulled out of the solution at 1 mm/min by means of an apparatus for producing Langmuir-Blodgett films. In this process, a uniform turquoise-colored acrylate layer is formed on the substrate. The reaction to form the superconducting oxide is carried out according to the following schedule: heat to 400° C. in 10 h and keep at this temperature for 5 h, heat in a further 4 h to 950° C. and keep there for 6 h, then cool to 400° C. in 4 h and age the sample at this temperature for approximately 4 h. A black superconducting layer having the composition $YBa_2Cu_3O_{7-x}$ is formed.

EXAMPLE 4

A dried polyacrylate having a Y:Ba:Cu metal ratio of 1:2:3 was decomposed thermally. The result of the thermogravimetric analysis is shown in FIG. 1.

I claim:

1. A process for producing a solution which comprising the steps and sequentially dissolving salts of the metals Y, Ba, Cu in water in an atomic ratio of 1:2:3, adding an aqueous solution of polyacrylic acid to the solution so that 0.03 to 0.16 atoms of $Y^{3+}$ are present per carboxyl group of the polyacrylic acid, adjusting the pH to a value of at least 10 adding a thermally degradable base, and concentrating the mixture until it has a viscosity of 150 to 10,000 cSt.

2. A process for producing a solution which comprising the steps of sequentially dissolving salts of the metals Bi, Ca, Sr and Cu in water in an atomic ratio which corresponds to a high-temperature superconductor, combining the solution with an aqueous solution of polyacrylic acid, 0.04–0.4 atoms of $Cu^{2+}$ being present per carboxyl group of the polyacrylic acid, adjusting the pH to a value of at least 10 by adding a thermally degradable base and concentrating the mixture until it has a viscosity of 150 to 10,000 cSt.

3. The process as claimed in claim 1, wherein the nitrates of Y, Ba and Cu are dissolved in water.

4. The process as claimed in claim 1, wherein 2 to 10% by weight of a plasticizer is added to the mixture.

5. The process as claimed in claim 1, wherein a polyacrylic acid having an average molecular weight in the range from 1000 to 10,000, is used.

6. The process as claimed in claim 2, wherein a polyacrylic acid having an average molecular weight in the range from 1000 to 10,000, is used.

7. The process as claimed in claim 5, wherein 0–0.5 g of a polyacrylic acid having a molecular weight of $5 \times 10^5$ to $1 \times 10^6$ is further added to the mixture per gram of polyacrylic acid having a molecular weight of 1000 to 10,000.

8. The process as claimed in claim 6, wherein 0–0.5 g of a polyacrylic acid having a molecular weight of $5 \times 10^5$ to $1 \times 10^6$ is further added to the mixture per gram of polyacrylic acid having a molecular weight of 1000 to 10,000.

9. The process as claimed in claim 2, wherein a polyacrylic acid having an average molecular weight in the range from 2000–5000 is used.

10. The process as claimed in claim 6, wherein a polyacrylic acid having an average molecular weight in the range from 2000–5000 is used.

* * * * *